US012588256B2

(12) United States Patent
Huang et al.

(10) Patent No.: US 12,588,256 B2
(45) Date of Patent: Mar. 24, 2026

(54) METHOD FOR MANUFACTURING SEMICONDUCTOR STRUCTURE AND SEMICONDUCTOR STRUCTURE THEREOF

(71) Applicant: TAIWAN SEMICONDUCTOR MANUFACTURING COMPANY LTD., Hsinchu (TW)

(72) Inventors: Yong-Sheng Huang, Hsinchu City (TW); Hung-Shu Huang, Taichung City (TW); Jhih-Bin Chen, Hsinchu (TW); Chung-Huai Chang, Taichung City (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 381 days.

(21) Appl. No.: 18/314,277

(22) Filed: May 9, 2023

(65) Prior Publication Data

US 2024/0379743 A1     Nov. 14, 2024

(51) Int. Cl.
*H10D 62/10*        (2025.01)
*H01L 21/762*       (2006.01)
*H10D 30/60*        (2025.01)

(52) U.S. Cl.
CPC ..... *H10D 62/115* (2025.01); *H01L 21/76224* (2013.01); *H10D 30/60* (2025.01)

(58) Field of Classification Search
CPC ........................... H10D 30/60; H10D 62/115; H01L 21/76224; H01L 21/76232
USPC ......................................................... 257/401
See application file for complete search history.

(56) References Cited

U.S. PATENT DOCUMENTS 9,553,194 B1 *   1/2017   Licausi ................ H10D 62/117
2020/0105612 A1 *   4/2020   Lin ...................... H10D 64/015

* cited by examiner

*Primary Examiner* — Monica D Harrison
(74) *Attorney, Agent, or Firm* — WPAT LAW; Anthony King

(57) ABSTRACT

A semiconductor structure includes a first, second and third isolations. The first isolation and a second isolation are disposed in a substrate and substantially parallel to each other, wherein a portion of the substrate is disposed between the first isolation and the second isolations. The third isolation is disposed over the portion of the substrate between the first and second isolations. A top surface of the third isolation is substantially aligned with top surfaces of the first and second isolations. A first step is between a bottom surface of the third isolation and a bottom surface of the first isolation. A second step between the bottom surface of the third isolation and a bottom surface of the second isolation. A method for manufacturing a semiconductor structure is also provided.

20 Claims, 25 Drawing Sheets

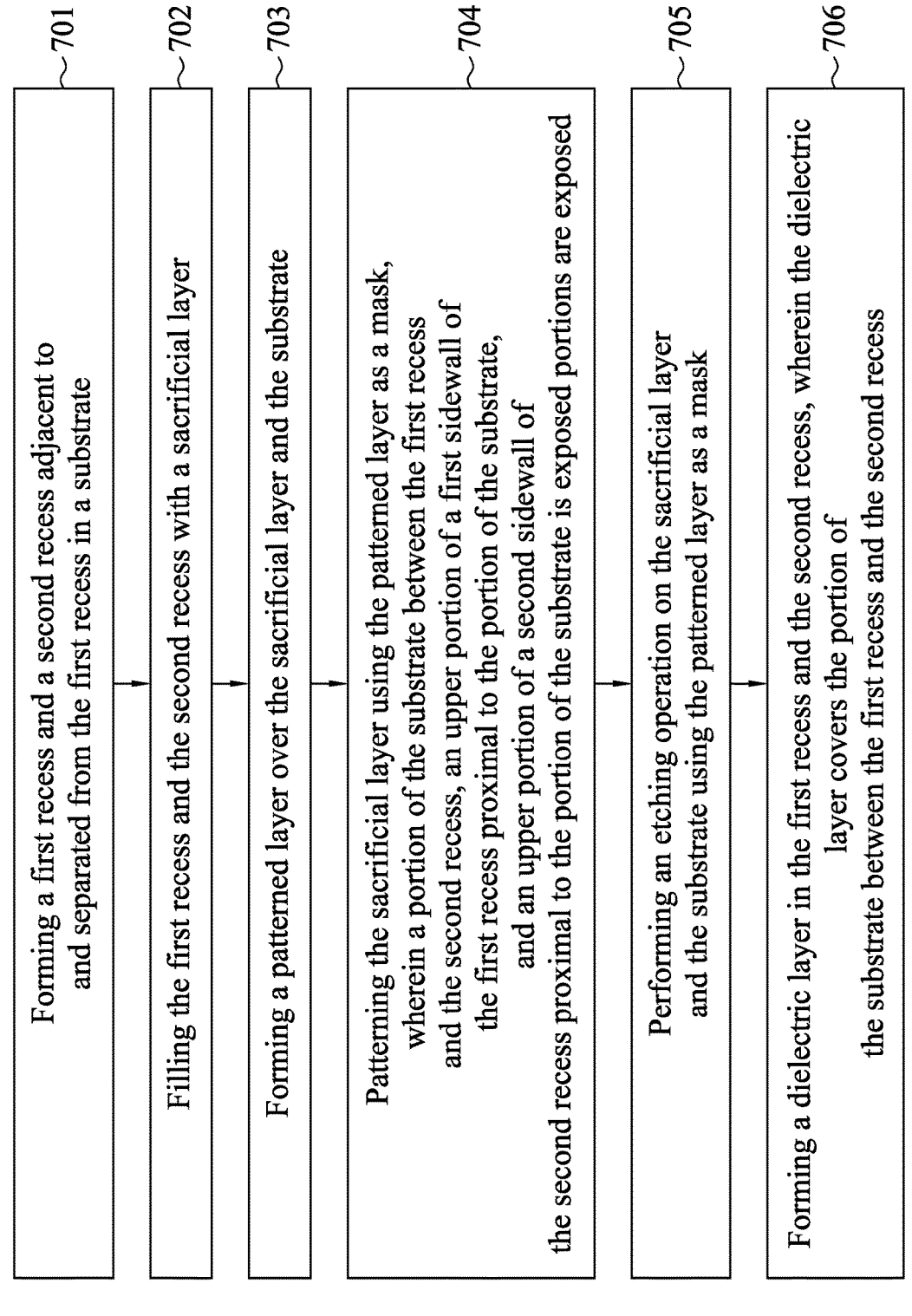

701 Forming a first recess and a second recess adjacent to and separated from the first recess in a substrate 702 Filling the first recess and the second recess with a sacrificial layer 703 Forming a patterned layer over the sacrificial layer and the substrate 704 Patterning the sacrificial layer using the patterned layer as a mask, wherein a portion of the substrate between the first recess and the second recess, an upper portion of a first sidewall of the first recess proximal to the portion of the substrate, and an upper portion of a second sidewall of the second recess proximal to the portion of the substrate is exposed portions are exposed 705 Performing an etching operation on the sacrificial layer and the substrate using the patterned layer as a mask 706 Forming a dielectric layer in the first recess and the second recess, wherein the dielectric layer covers the portion of the substrate between the first recess and the second recess

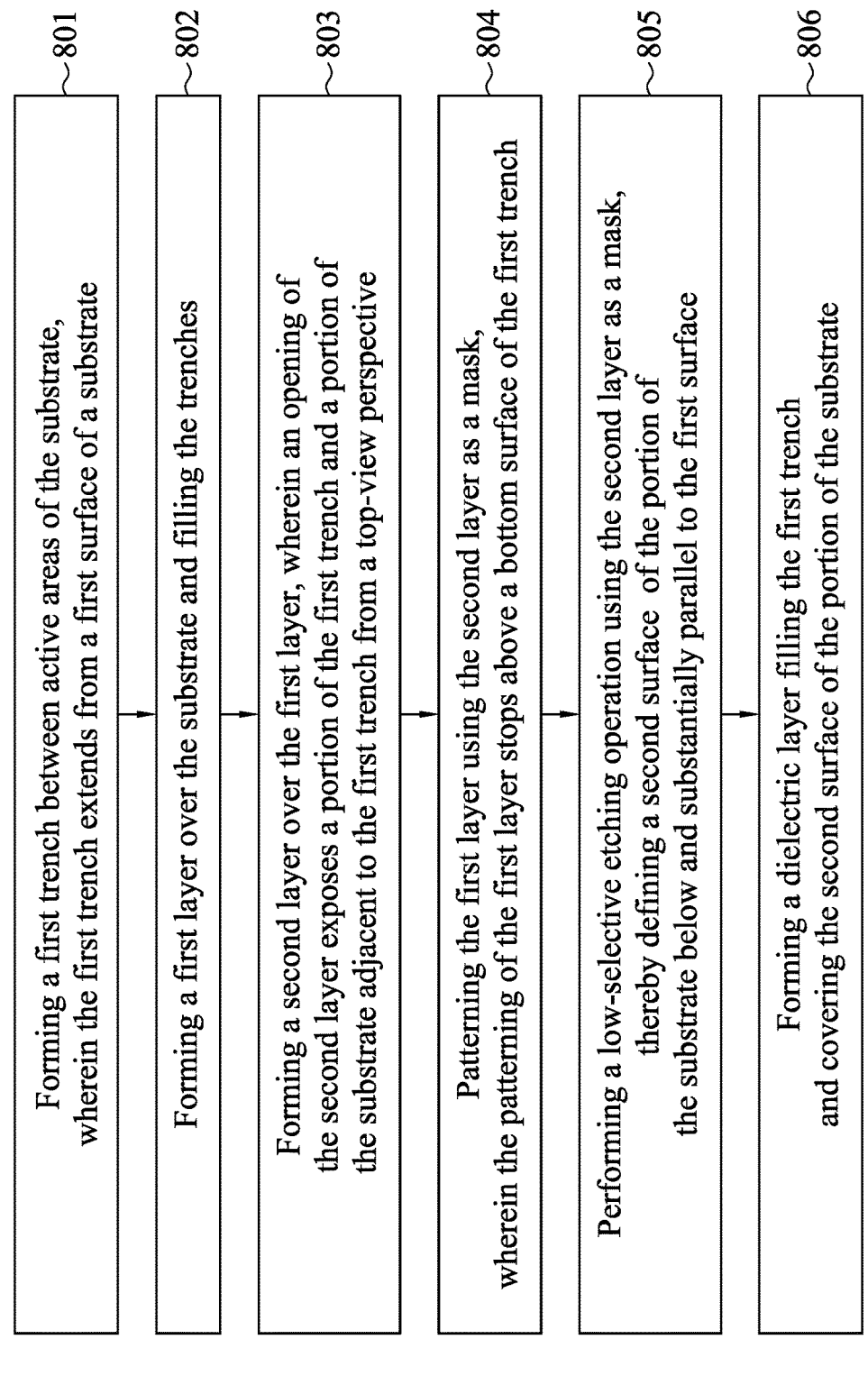

801 Forming a first trench between active areas of the substrate, wherein the first trench extends from a first surface of a substrate 802 Forming a first layer over the substrate and filling the trenches 803 Forming a second layer over the first layer, wherein an opening of the second layer exposes a portion of the first trench and a portion of the substrate adjacent to the first trench from a top-view perspective 804 Patterning the first layer using the second layer as a mask, wherein the patterning of the first layer stops above a bottom surface of the first trench 805 Performing a low-selective etching operation using the second layer as a mask, thereby defining a second surface of the portion of the substrate below and substantially parallel to the first surface 806 Forming a dielectric layer filling the first trench and covering the second surface of the portion of the substrate

METHOD FOR MANUFACTURING SEMICONDUCTOR STRUCTURE AND SEMICONDUCTOR STRUCTURE THEREOF

BACKGROUND

Semiconductor devices are used in a variety of electronic applications, such as personal computers, cellular phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. As the semiconductor industry has progressed into advanced technology process nodes in pursuit of greater device density, an issue of a planar result of material filling has arisen.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, dimensions of the various features may be arbitrarily increased or reduced for clarity of discussion.

FIG. 23 is a flow diagram of a method for manufacturing a semiconductor structure in accordance with some embodiments of the disclosure.

FIG. 24 is a flow diagram of a method for manufacturing a semiconductor structure in accordance with some embodiments of the disclosure.

DETAILED DESCRIPTION

Figure 1:
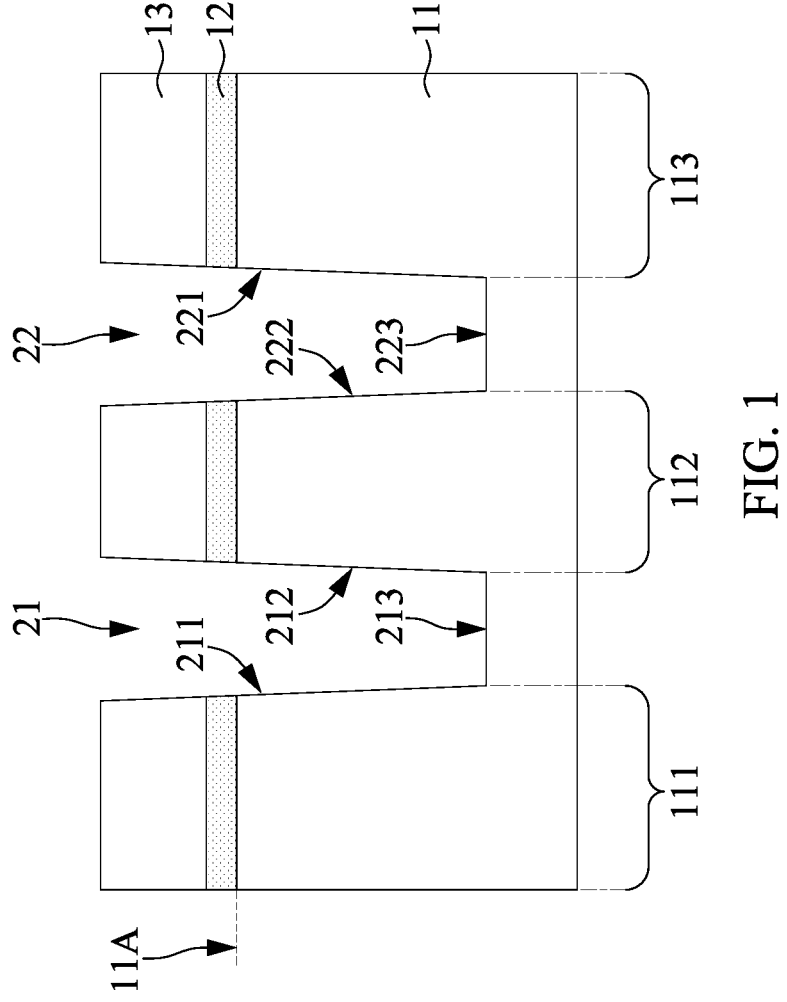
FIGS. 1 to 2 are schematic cross-sectional diagrams at different stages of a method for manufacturing a semiconductor structure in accordance with different embodiments of the disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

An uneven or recessed surface of an element can result in unwanted residue of materials, and it may lead to defect of a device or additional cost and processing for removing the residue. For example, when a dummy gate is formed over a recessed surface, a top surface of the dummy gate can include a recess due to the recessed surface. Residues remained in the recess of the top surface of the dummy gate can result in incomplete metal gate replacement. The present disclosure provides a method of manufacturing a semiconductor structure including integration of formation of different isolations, and thereby providing a common planar surface of different isolations. A manufacturing cost can be controlled, and a product yield can be improved.

FIGS. 1 to 19 are schematic diagrams at different stages of a method for forming a semiconductor structure in accordance with some embodiments of the present disclosure. For a purpose of clarity and simplicity, reference numbers of elements with same or similar functions are repeated in different embodiments. However, such usage is not intended to limit the present disclosure to specific embodiments or specific elements. In addition, conditions or parameters illustrated in different embodiments can be combined or modified to form different combinations of embodiments as long as the parameters or conditions used are not in conflict.

Referring to FIG. 1, a substrate 11 is provided, received, or formed in accordance with some embodiments of the present disclosure. In some embodiments, the substrate 11 includes a bulk semiconductor material, such as silicon. The substrate 11 may include another elementary semiconductor, such as germanium; a compound semiconductor including silicon carbide, gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In some embodiments, the substrate 1 is a semiconductor-on-insulator (SOI) substrate.

A dielectric layer 12 and a dielectric layer 13 are sequentially formed over the substrate 11. In some embodiments, the dielectric layer 12 and/or 13 is formed by a deposition. The dielectric layers 12 and 13 can include different dielectric materials, such as silicon oxide ($SiO_x$), silicon nitride ($Si_xN_y$), silicon oxynitride (SiON), other low-k dielectric materials, high-k dielectric materials, or a combination thereof. In some embodiments, the dielectric layer 12 is a pad oxide layer. In some embodiments, the dielectric layer 13 is referred to as an etch stop layer for a purpose of detection of a termination of a chemical-mechanical polishing (CMP) operation in subsequent processing. In some embodiments, the dielectric layer 13 is a silicon nitride layer.

In some embodiments, the dielectric layer 13 is patterned, and positions of trenches 21 and 22 of the substrate 11 are defined. In some embodiments, the dielectric layer 12 and the substrate 11 are patterned using the dielectric layer 13 as a mask to form the trenches 21 and 22. In some embodiments, the patterning operation on the dielectric layer 12 or 13 can include one or more etching operations. The etching operation can include a dry etch, a wet etch, an ion beam etch, a reactive ion etch, or other suitable method. Each of the trenches 21 and 22 can include a bottom surface and a pair of sidewalls, and inner sidewalls of the substrate 11 defines the bottom surfaces and the sidewalls of the trenches 21 and 22. In some embodiments, the trench 21 is defined by a lower surface 213, and two opposite sidewalls 211 and 212 connecting the lower surface 213. In some embodiments, the sidewall 212 is a planar sidewall at this stage. In some embodiments, the trench 22 is defined by a lower surface 223, and two opposite sidewalls 221 and 222 connecting the lower surface 223. In some embodiments, the sidewall 222 is a planar sidewall at this stage.

Active areas (e.g., 111, 112 and 113) of the substrate can be defined by the trenches 21 and 22. In some embodiments, the trenches 21 and 22 are referred to as recesses 21 and 22. In some embodiments, the trenches 21 and 22 are for a purpose of separation of different active areas (e.g., 111, 112 and 113). In some embodiments, the active areas 111, 112 and 123 are defined by the trenches 21 and 22. It should be noted that a number of trenches (e.g., two trenches) and a number of active areas (e.g., three active areas) shown in the figures are for a purpose of illustration, and it is not intended to limit the present disclosure. In some embodiments, depths of the trenches 21 and 22 are substantially equal, wherein the depths are measured from a top surface 11A of the substrate 11 along a vertical direction. In some embodiments, a depth of the trench 21 or 22 is in a range of 1500-3000 angstroms.

Figure 2:
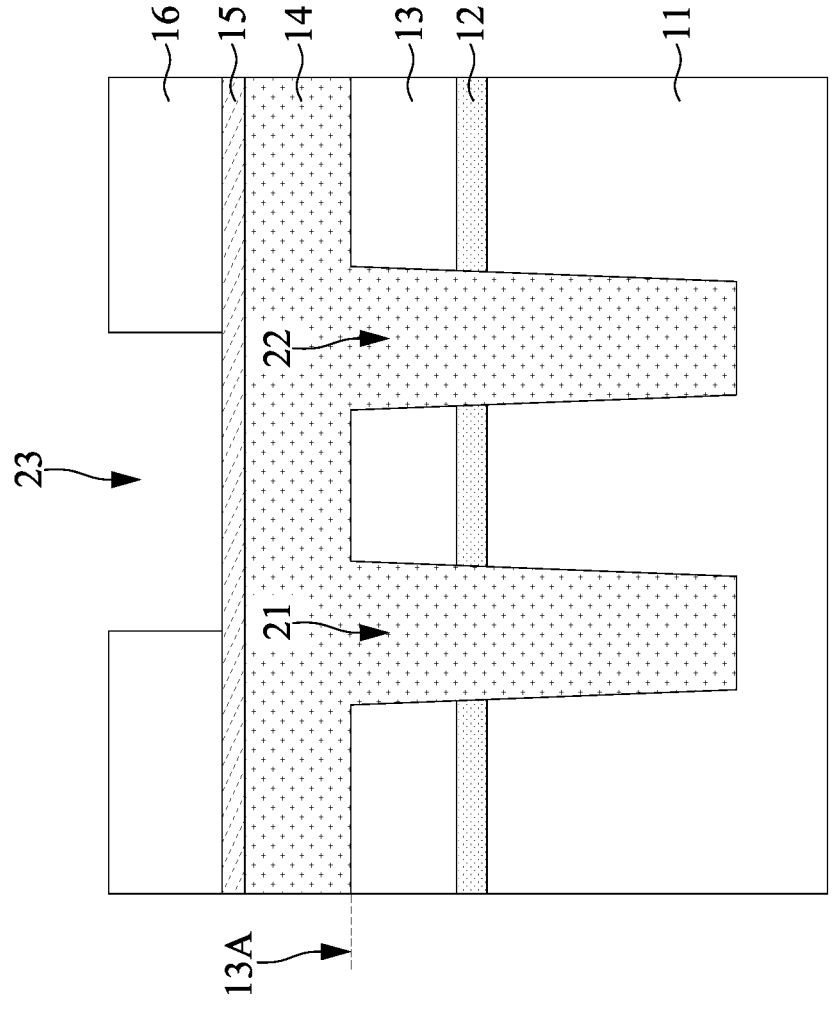

Referring to FIG. 2, a bottom layer 14, a middle layer 15 and a top layer 16 are subsequently formed over the substrate 11 and the dielectric layer 13 in accordance with some embodiments of the present disclosure. The bottom layer 14 may fill the trenches 21 and 22 and cover the top surface 11A of the substrate 11. In some embodiments, the bottom layer 14 fills an entirety of the trenches 21 and 22. In some embodiments, the bottom layer 14 has a planar top surface over the top surface 11A of the substrate 11. The bottom layer 14 may include a flowable material. In some embodiments, the bottom layer 14 includes polymers. In some embodiments, the bottom layer 14 is organic and includes oxide or oxygen. The middle layer 15 may be formed over the bottom layer 14. In some embodiments, the middle layer 15 contacts the bottom layer 14. The middle layer 15 may include carbide, nitride, oxynitride, or other suitable materials. In some embodiments, the middle layer 15 is a silicon carbide layer. The top layer 16 may be for a purpose of patterning the substrate 11. In some embodiments, the top layer 16 includes photoresist material. The top layer 16 may be referred to as a photoresist layer 16, a patterned layer 16, a mask layer 16 or a hard layer 16 in different embodiments. The top layer 16 includes an opening 23 for a purpose of definition of a position of an isolation to be formed in subsequent processing, wherein the isolation is for a purpose of dilution of an electric field of an active area. In some embodiments, the opening 23 overlaps a portion of the substrate 11 of an active area (e.g., 112). In other words, the opening 23 overlaps a portion of the substrate 11 between adjacent trenches (e.g., 21 and 22).

Figure 3:
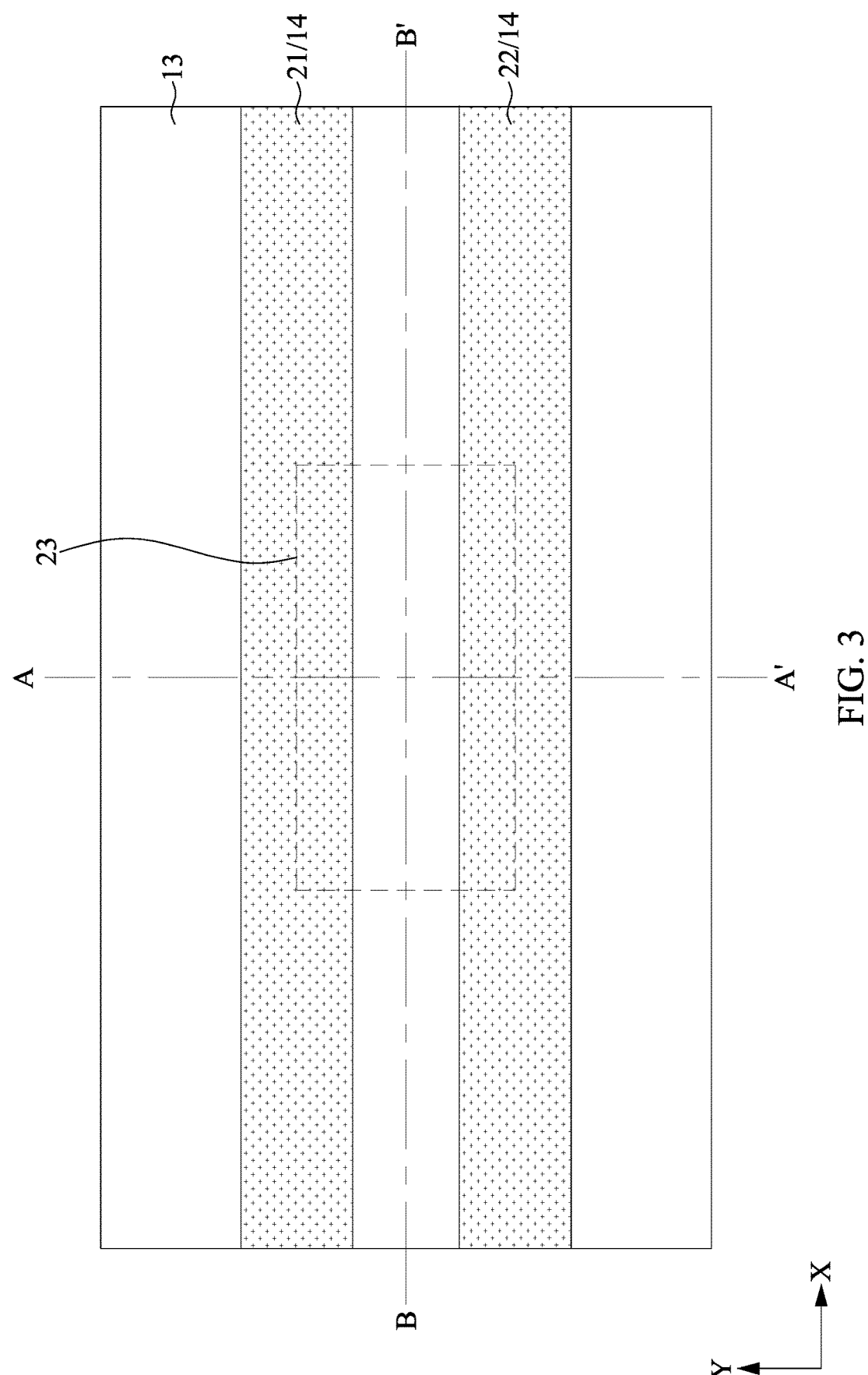
FIG. 3 is a schematic top-view perspective of a semiconductor structure in accordance with some embodiments of the disclosure.

FIG. 3 is a schematic top-view perspective of the intermediate structure at a top surface 13A of the dielectric layer 13 shown in FIG. 2 in accordance with some embodiments of the present disclosure. For a purpose of illustration, the opening 23 from the top-view perspective is shown in a dotted rectangle in FIG. 3. In some embodiments, a portion of the trench 21 is within the opening 23 from the top-view perspective. In some embodiments, a portion of the trench 22 is within the opening 23 from the top-view perspective. In some embodiments, the opening 23 extends across the portion of the substrate 11 between the trenches 21 and 22 from the top-view perspective.

Figure 4A:
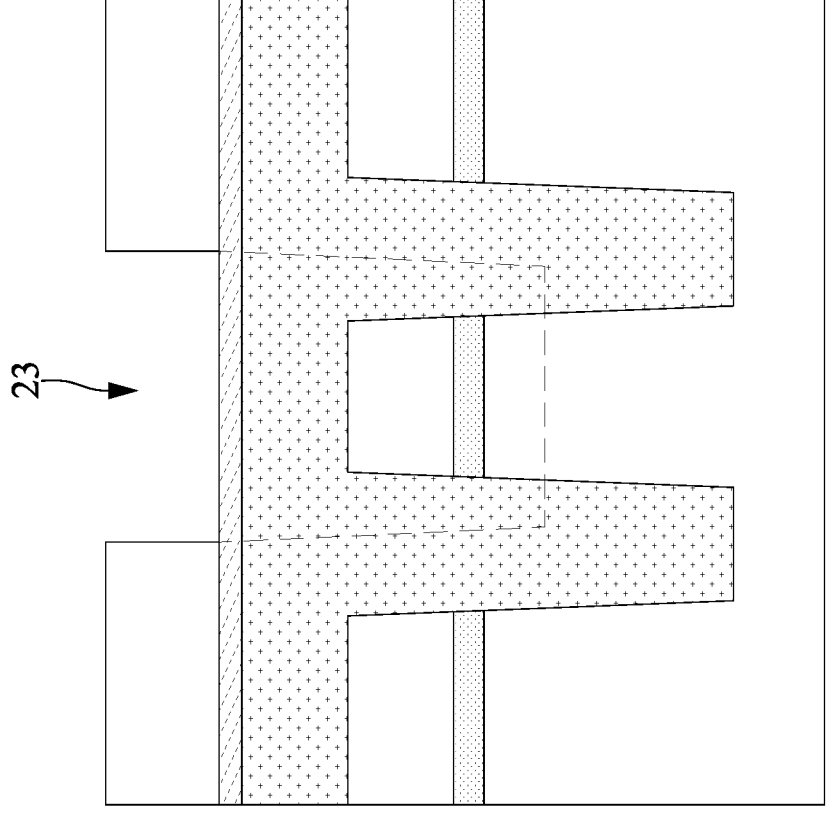
FIGS. 4A and 4B are schematic cross-sectional diagrams along lines A-A' and B-B' in FIG. 3 in accordance with some embodiments of the disclosure.
Figure 4A:
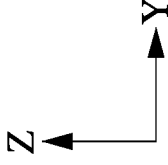
Figure 4B:
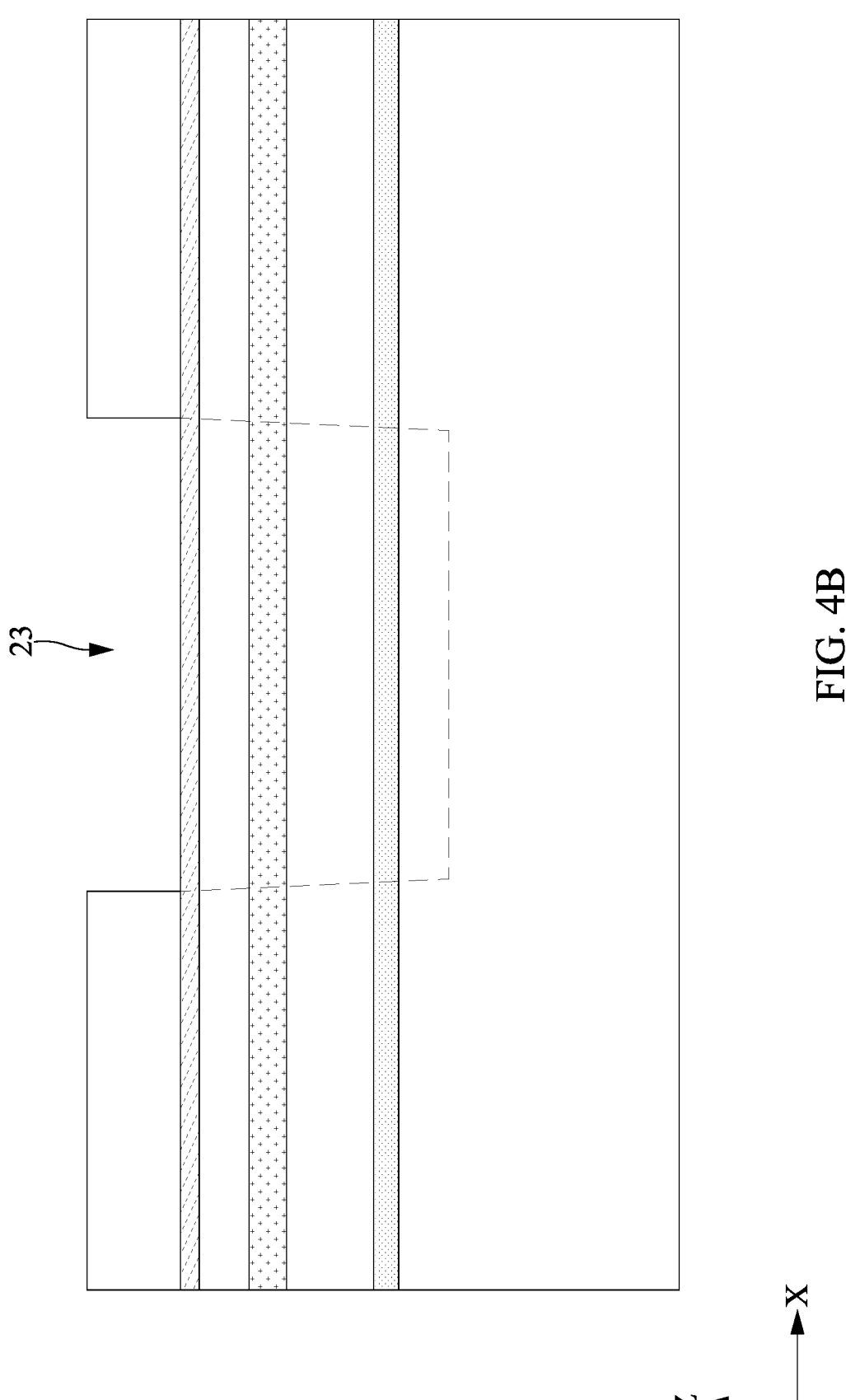

Referring to FIGS. 4A and 4B, a general profile of a shallow trench isolation (STI) to be defined by the top layer 16 is indicated in dotted lines, wherein FIG. 4A is a schematic cross-sectional diagram along a line A-A' in FIG. 3, and FIG. 4B is a schematic cross-sectional diagram along a line B-B' in FIG. 3. It should be noted that the dotted lines are for a purpose of indication of an area and a position of the STI to be formed. However, a profile of the STI may be different from the profile of the dotted lines shown in FIGS. 4A and 4B. In addition, for a purpose of illustration, in the following figures and description, only the cross-sections along the line A-A' shown in FIG. 3 at different stages of the method are illustrated, but it is not intended to limit the present disclosure.

The bottom layer 14, the middle layer 15 and the top layer 16 are for a purpose of formation of the STI. In some embodiment, the bottom layer 14, the middle layer 15 and the top layer 16 together are considered as a mask structure. In some embodiments, multiple patterning operations and/or multiple etching operations are performed on the bottom layer 14, the middle layer 15 and the top layer 16.

Figure 5:
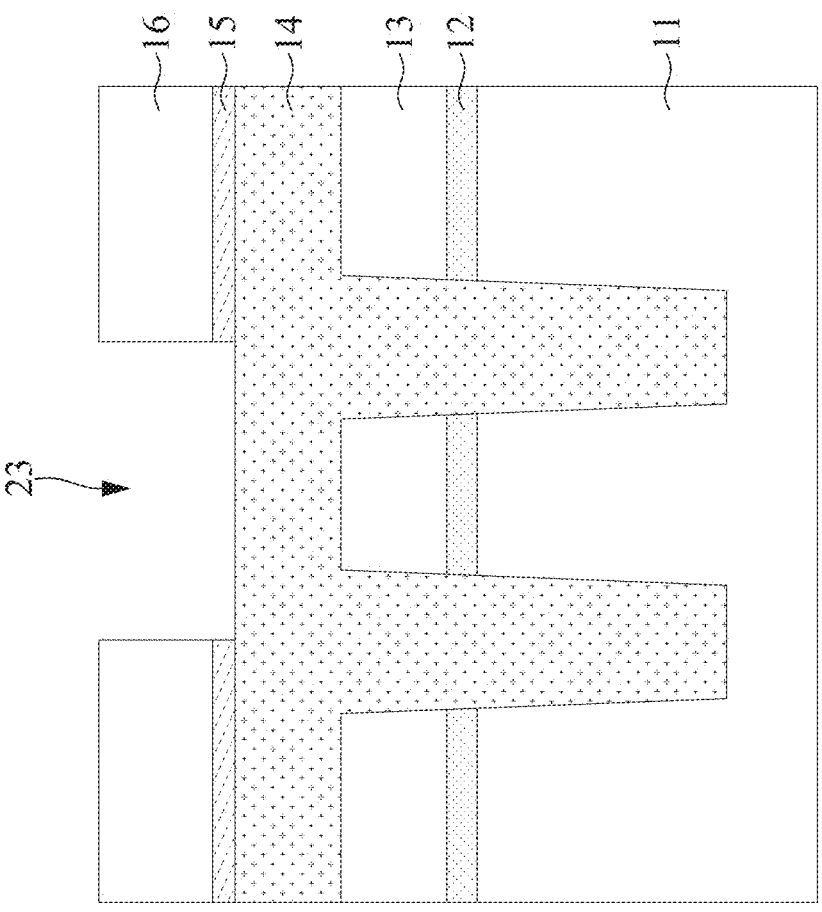
FIGS. 5 to 10 are schematic cross-sectional diagrams at different stages of a method for manufacturing a semiconductor structure in accordance with different embodiments of the disclosure.

Referring to FIG. 5, the middle layer 15 is patterned using the top layer 16 as a mask after the operations as depicted in FIG. 2 in accordance with some embodiments of the present disclosure. The patterning of the middle layer 15 may include a suitable etching operation, such as a dry etching operation. In some embodiments, a portion of the middle layer 15 exposed by the opening 23 as shown in FIG. 2 is removed. In some embodiments, an etchant used to remove the portion of the middle layer 15 includes sulfur hexafluoride, oxygen, or a mixture thereof. In some embodiments, a portion of the bottom layer 14 is exposed by the opening 23 after the patterning of the middle layer 15.

Figure 6:
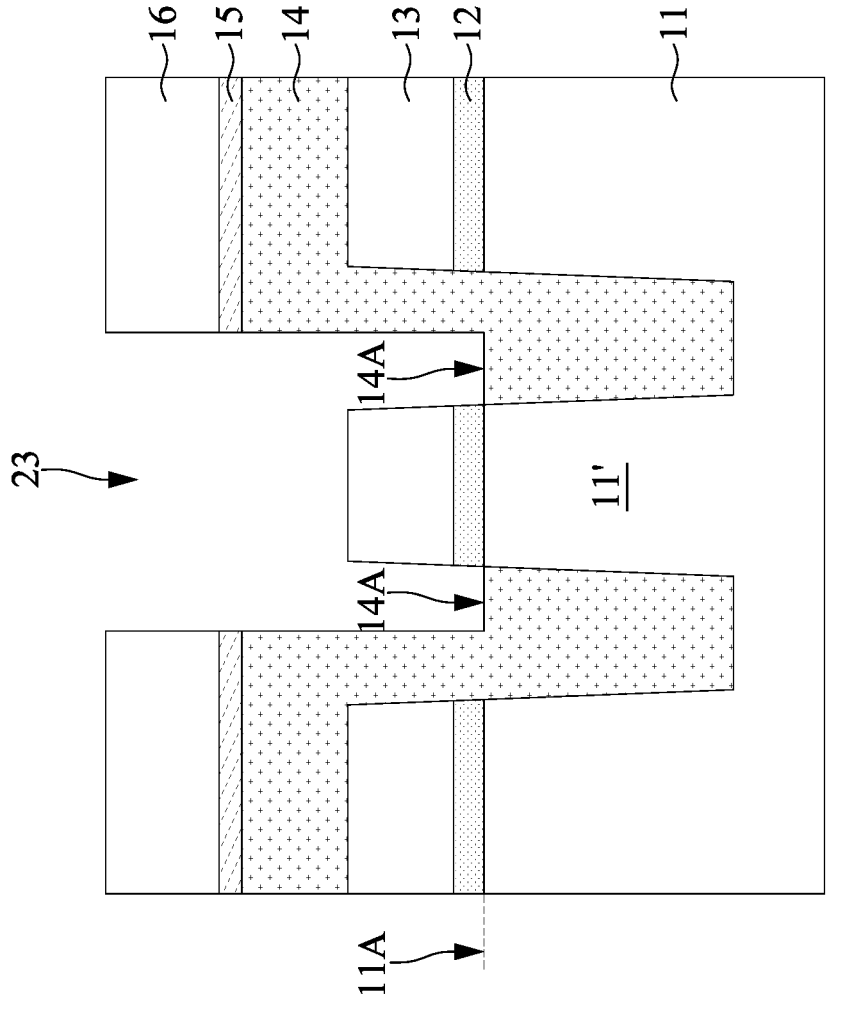

Referring to FIG. 6, a first operation is preformed on the bottom layer 14, and a portion of the bottom layer 14 exposed by the opening 23 is removed in accordance with some embodiments of the present disclosure. In some embodiments, the first operation includes an etching operation. In some embodiments, an etchant of the etching operation of the first operation includes oxygen. In some embodiments, the first operation stops until an entirety of portions of the dielectric layers 12 and 13 overlapped by the opening 23 are exposed. In some embodiments, the first operation stops when the bottom layer 14 vertically overlapped by the opening 23 is below or aligned with the top surface 11A of the substrate 11. In some embodiments, an upper surface 14A of the portion of the bottom layer 14 exposed by the opening 23 is below or aligned with the top surface 11A of the substrate 11. In some embodiments, the upper surface 14A of the portion of the bottom layer 14 surrounds the portion of the substrate 11 overlapped by the opening 23 and between the trenches 21 and 22 shown in FIG. 2. In some embodiments, the upper surface 14A includes two regions disposed on two opposite sides of the portion of the substrate 11. For a purpose of illustration, the portion of the substrate 11 between the trenches 21 and 22 is labelled as the portion 11' of the substrate 11. Removal of the portions of the dielectric layers 12 and 13 overlapped by the openings 23 is performed in subsequent processing, and the portions of the dielectric layers 12 and 13 should be entirely exposed for a purpose of the removal in the following processing.

Figure 7:
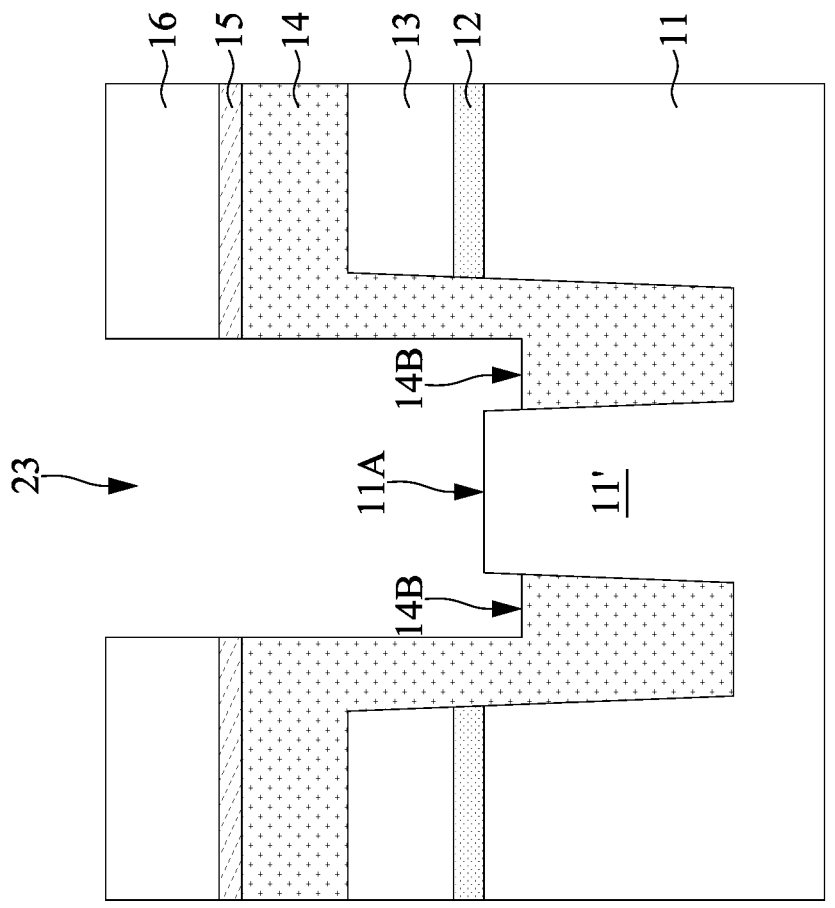

Referring to FIG. 7, a second operation is preformed on the dielectric layers 12 and 13, and the portions of the dielectric layers 12 and 13 exposed by the opening 23 are removed in accordance with some embodiments of the present disclosure. In some embodiments, the second operation includes an etching operation. In some embodiments, an etchant of the etching operation of the second operation includes difluoromethane. In some embodiments, the second operation stops until an entirety of the portions of the dielectric layers 12 and 13 overlapped by the opening 23 is removed. In some embodiments, a portion of the bottom layer 14 is also removed by the second operation. In some embodiments, the upper surface 14A of the portion of the bottom layer 14 exposed by the opening 23 shown in FIG. 6 is moved downward, and an upper surface 14B is defined after the second operation. In some embodiments, the upper surface 14B is below the top surface 11A of the substrate 11. In some embodiments, the upper surface 14B includes two regions disposed at two opposite sides of the portion 11' of the substrate 11. In some embodiments, an elevation of the two regions of the upper surface 14B are substantially the same.

Figure 8:
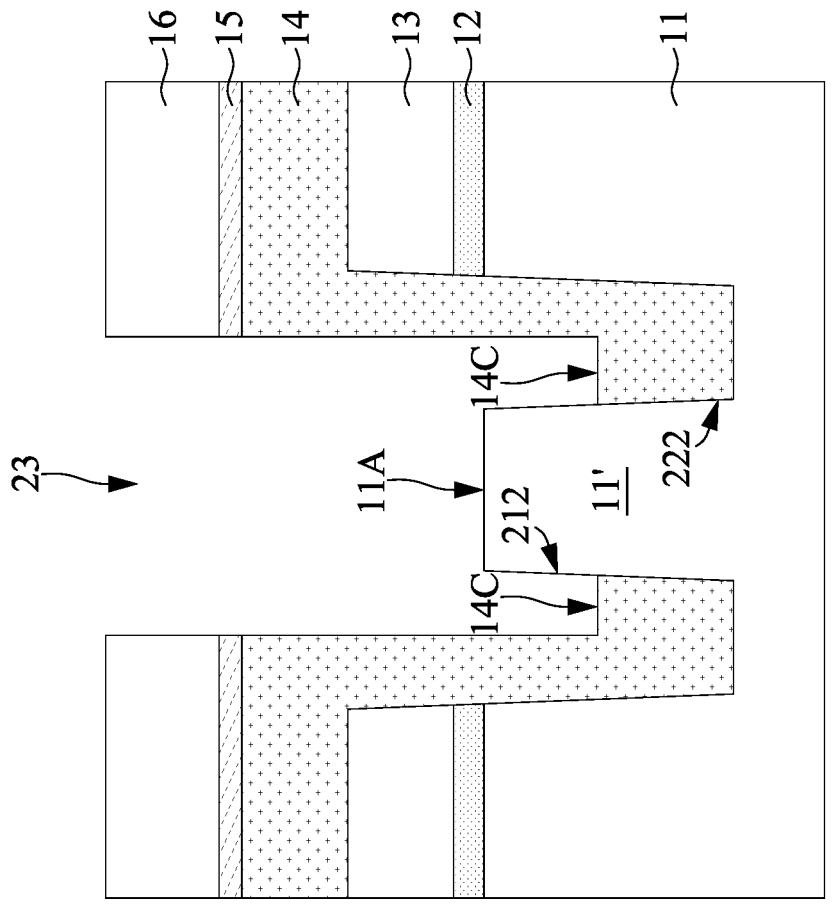

Referring to FIG. 8, a third operation is preformed on the bottom layer 14, and the portion of the bottom layer 14 exposed by the opening 23 is partially removed in accordance with some embodiments of the present disclosure. In some embodiments, the third operation includes an etching operation. In some embodiments, an etchant of the etching operation of the third operation includes oxygen. In some embodiments, the etchant has a high selectivity to the bottom layer 14 and a low selectivity to the substrate 11.

The portion 11' of the substrate 11 is partially exposed for a purpose of an easier removal of a part of the portion 11' of the substrate 11 for formation of the STI in subsequent processing. A portion of the sidewall 212 and a portion of the sidewall 222 are exposed. In some embodiments, an upper surface 14C of the portion of the bottom layer 14 within an overlapping area of the opening 23 is defined after the third operation, and the upper surface 14C is below the upper surface 14B as shown in FIG. 7. In some embodiments, a portion of the upper surface 14C adjacent to the sidewall 212 is substantially aligned with a portion of the upper surface 14C adjacent the sidewall 222. In some embodiments, a distance between the upper surface 14C and the upper surface 14B is in a range of 150-300 angstroms.

Figure 9:
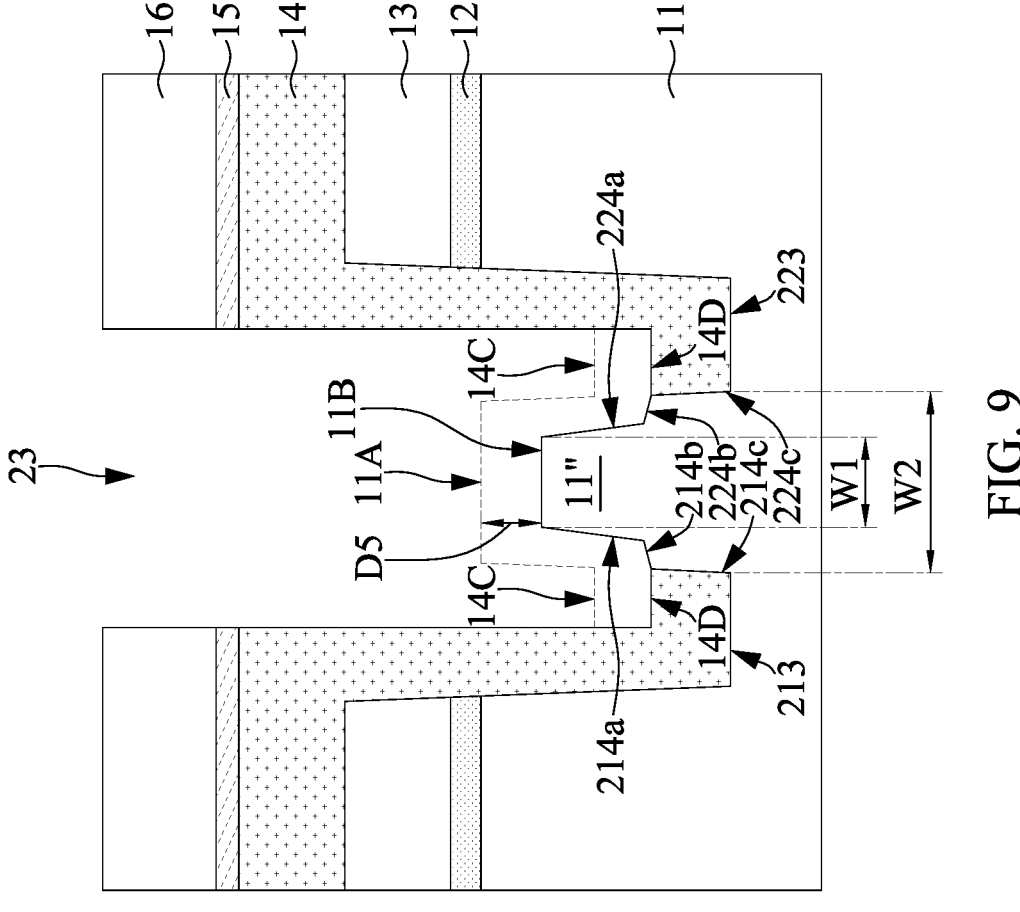

Referring to FIG. 9, a fourth operation is preformed on the bottom layer 14 and the portion 11' of the substrate, and the portion 11' is partially removed in accordance with some embodiments of the present disclosure. In some embodiments, the fourth operation includes an etching operation. In some embodiments, an etchant of the etching operation of the fourth operation includes carbon tetrafluoride, chlorine, oxygen, or a mixture thereof. In some embodiments, the etching operation of the fourth operation is a non-selective etching operation. In some embodiments, the etching operation of the fourth operation has a low selectivity to the bottom layer 14 and the substrate 11. The portion 11' of the substrate 11 is partially removed, and a portion 11" is defined between the trenches 21 and 22 as shown in FIG. 2 after the fourth operation. In some embodiments, a top surface 11B of the portion 11" of the substrate 11 is at a horizontal level between that of the top surface 11A and that of the lower surface 213 or 223.

For a purpose of illustration, a profile of the portion 11' and the upper surface 14C is shown in a dotted line in FIG. 9. In some embodiments, a distance D5 between the top surface 11A of the substrate 11 and the top surface 11B of the portion 11" is in a range of 150 to 500 angstroms. The distance D5 defines a depth of the STI to be formed in the subsequent processing. In some embodiments, the fourth operation stops when the distance D5 reaches a default value. In some embodiments, an upper surface 14D of the bottom layer 14 within the overlapping area of the opening 23 is defined after the fourth operation.

In some embodiments, a width W1 of the top surface 11B of the portion 11" is less than a width W2 of a bottom of the portion 11", wherein the width W2 is substantially equal to a distance between the lower surfaces 213 and 223. In some embodiments, the portion 11" of the substrate 11 has a step configuration as shown in FIG. 9. In some embodiments, configurations of the sidewalls 212 and 222 shown in FIG. 8 are changed by the fourth operation, and sidewalls 214 and

224 are formed by the fourth operation. Each of the sidewalls 214 and 224 may have a step configuration. In some embodiments, the sidewall 214 after the fourth operation includes an upper portion 214a, a tread portion 214b and a lower portion 214c. In some embodiments, the upper portion 214a connects to the trend portion 214b, and the tread portion 214b connects to the lower portion 214c. In some embodiments, the lower portion 214c is covered by the bottom layer 14, and the tread portion 214b and the upper portion 214a are exposed. In some embodiments, a portion of the upper surface 14D connects an intersecting corner of the tread portion 214b and the upper portion 214a. In some embodiments, the sidewall 224 after the fourth operation includes an upper portion 224a, a tread portion 224b and a lower portion 224c. In some embodiments, the upper portion 224a connects to the trend portion 224b, and the tread portion 224b connects to the lower portion 214c. In some embodiments, the lower portion 224c is covered by the bottom layer 14, and the tread portion 224b and the upper portion 224a are exposed. In some embodiments, a portion of the upper surface 14D connects an intersecting corner of the tread portion 224b and the upper portion 224a.

Figure 10:
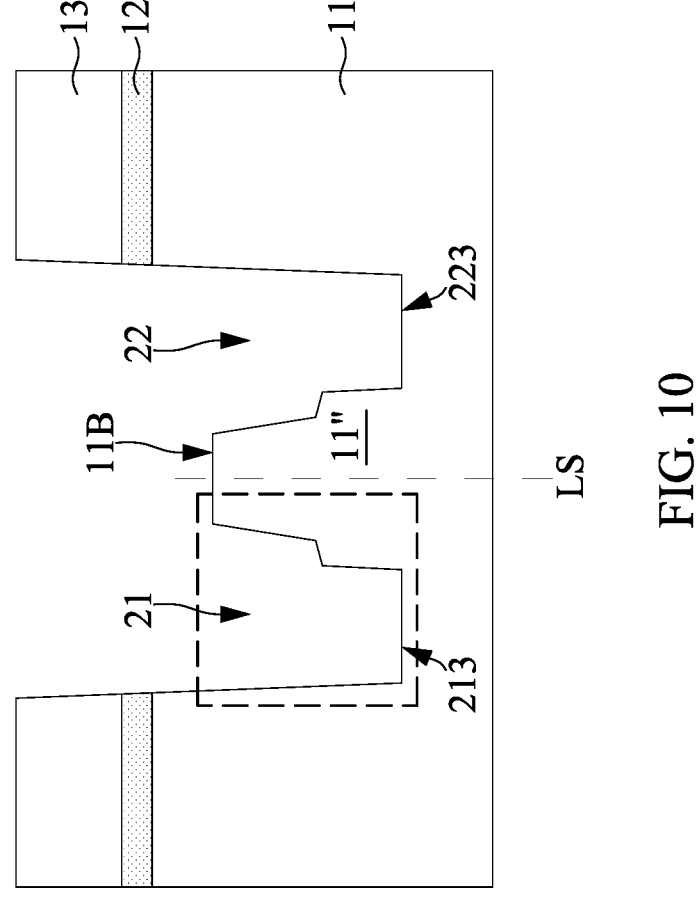

Referring to FIG. 10, the top layer 16, the middle layer 15 and the bottom layer 14 are removed after the fourth operation in accordance with some embodiments of the present disclosure. The top layer 16, the middle layer 15 and the bottom layer 14 can sequentially removed by individual operations or concurrently by a same etching operation. Conventional method can be applied, and it is not limited herein.

Figure 11:
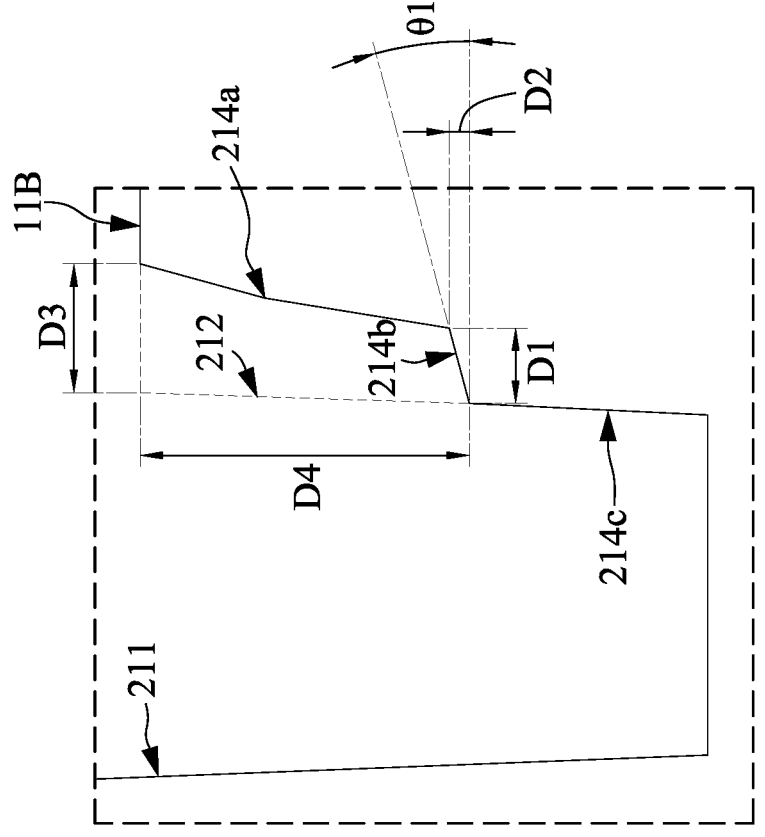
FIG. 11 is an enlarged diagram of a portion of a semiconductor structure show in FIG. 10 in accordance with some embodiments of the disclosure.
Figure 11:
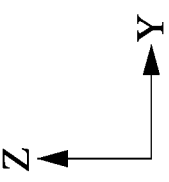

FIG. 11 is an enlarged diagram of a dotted region shown in FIG. 10 in accordance with some embodiments of the present disclosure. It should be noted that only the enlarged view of the sidewall 214 is shown for a purpose of illustration. The configuration of the sidewall 224 can be similar to or substantially symmetrical with respect to the portion 11" of the substrate 11. In some embodiments, the step on the sidewall 214 and the step on the sidewall 224 are substantially symmetric with respect to a dotted line LS shown in FIG. 10.

In some embodiments, the lower portion 214c is a tilt sidewall, and has a substantially planar surface. In some embodiments, the tread portion 214b is a substantially planar surface. In some embodiments, an elevation angle θ1 of the tread portion 214b is in a range of 0 to 45 degrees. In some embodiments, a width D1 of the tread portion 214b is in a range of 5 to 60 nm. In some embodiments, a vertical distance D2 of the tread portion 214b is in a range of 0 to 60 nm. In some embodiments, the upper portion 214a has a smooth surface. In some embodiments, the upper portion 214a is a curved surface. In other words, the upper portion 214a has a slope various along a vertical direction. In some embodiments, a slope of the upper portion 214a at a point reduces as it closer to the upper surface 11B due to a property of an etching operation of the fourth operation. In some embodiments, the upper portion 214a includes a curved surface bending away from the sidewall 211. In some embodiments, a vertical distance D4 between the top surface 11B and the lower portion 214c is in a range of 90 to 180 nm. For a purpose of illustration, the sidewall 212 prior to the fourth operation is indicated by a dotted line shown in FIG. 11. In some embodiments, a maximum of a horizontal distance between the sidewall 214 and the sidewall 212 occurs at an intersecting corner of the top surface 11B and the upper portion 214a. In some embodiments, a distance D3 between the sidewall 212 and the intersecting corner of the top surface 11B and the upper portion 214a is in a range of 20 to 70 nm.

Figure 12:
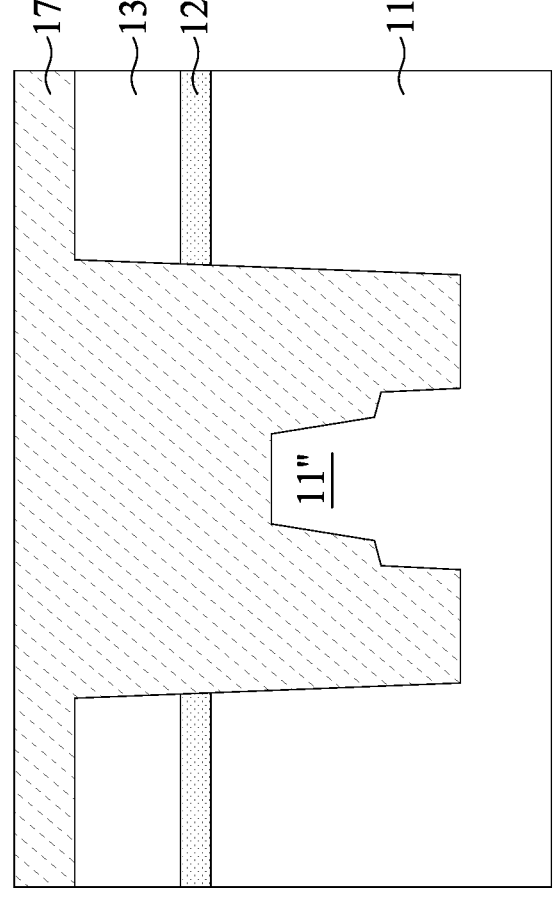
FIGS. 12 to 21 are schematic cross-sectional diagrams at different stages of a method for manufacturing a semiconductor structure in accordance with different embodiments of the disclosure.

Referring to FIG. 12, a dielectric layer 17 is formed over the substrate 11 in accordance with some embodiments of the present disclosure. In some embodiments, the dielectric layer 17 fills the trenches 21 and 22 shown in FIG. 11 and the space over the portion 11" of the substrate 11. In some embodiments, the dielectric layer 17 also covers the dielectric layer 13. A material of the dielectric layer 17 can be selected from the material of the dielectric layer 13 listed above. In some embodiments, the dielectric layer 17 includes a dielectric material different from that of the dielectric layer 13.

Figure 13:
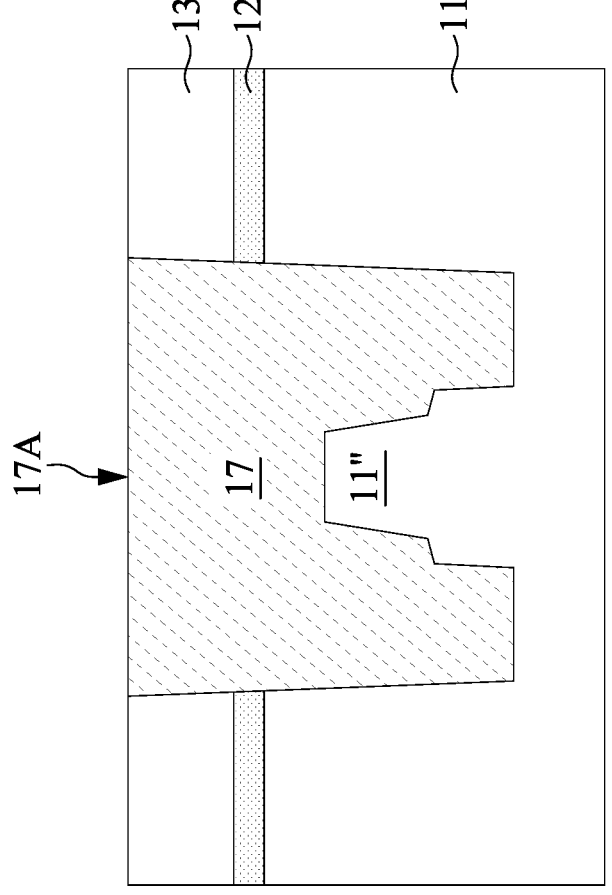

Referring to FIG. 13, a planarization is performed on the dielectric layer 17 in accordance with some embodiments of the present disclosure. In some embodiments, a portion of the dielectric layer 17 above the dielectric layer 13 is removed. In some embodiments, a top surface 17A is a substantially planar surface and aligned with a top surface of the dielectric layer 13. The planarization may include an etching operation or a polishing (e.g., CMP) operation. In some embodiments, the planarization stops on an exposure of the dielectric layer 13. The dielectric layer 13 may function as an etch stop layer of the planarization.

Figure 14:
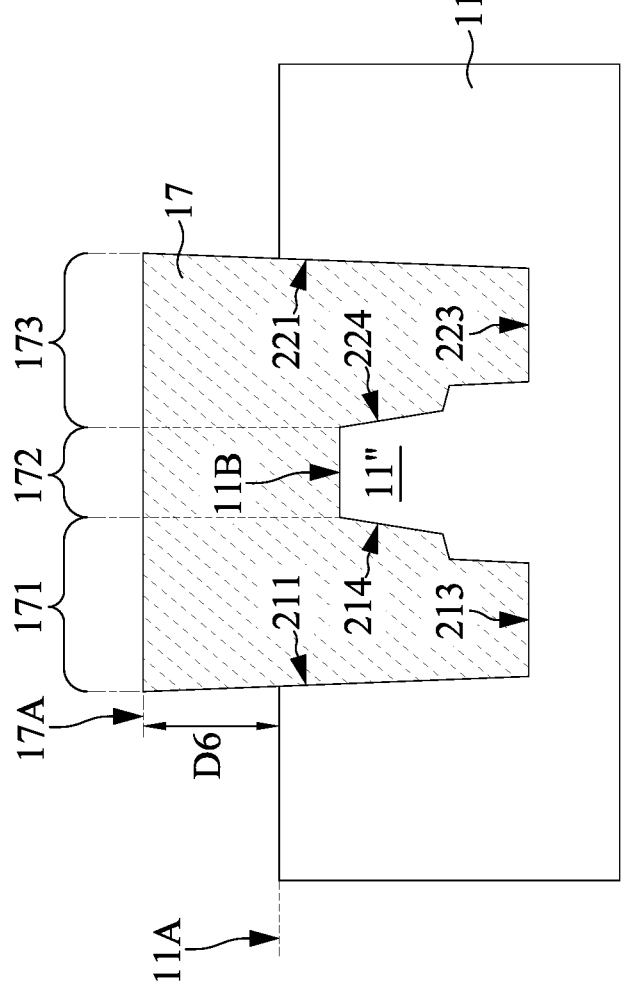
Figure 15:
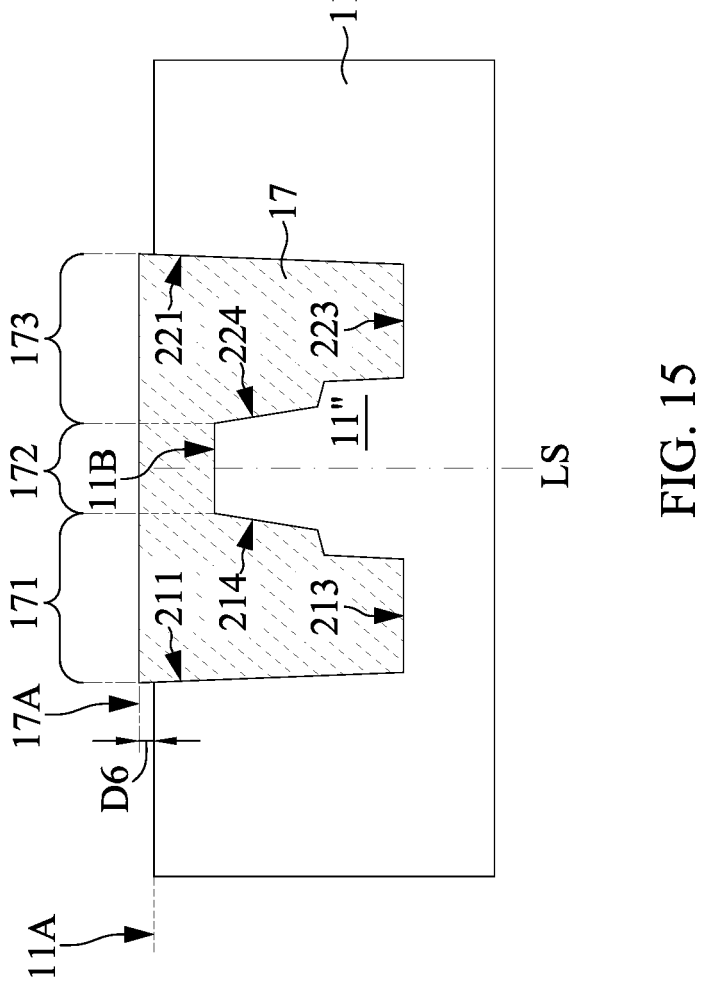

Referring to FIGS. 14 and 15, the dielectric layers 12 and 13 are removed after the planarization in accordance with some embodiments of the present disclosure. The dielectric layer 17 may protrude from the top surface 11A of the substrate 11. A distance D6 between the top surface 17A and the top surface 11A should be less than 30 nm. In some embodiments, an acidic solvent is provided on the dielectric layer 17 thereby to reduce the distance D6 between the top surface 17A and the top surface 11A as shown in FIG. 15 if the distance D6 is greater than 30 nm. Other operations, such as an etching operation, can be applied to reduce the distance D6, and it is not limited herein.

As shown in FIGS. 14 and 15, different portions of the dielectric layer 17 may have different depths for different purposes. The dielectric layer 17 may include three portions 171, 172 and 173. The portion 171 of the dielectric layer 17 is defined by the sidewalls 211 and 214 and the lower surface 213 of the substrate 11. The portion 173 of the dielectric layer 17 is defined by the sidewalls 221 and 224 and the lower surface 223 of the substrate 11. The portion 172 of the dielectric layer 17 is between the portions 171 and 172 and disposed vertically over the top surface 11B of the portion 11" of the substrate 11. In some embodiments, the portions 171 and 173 are for a purpose of separation of different active areas (e.g., 111, 112 and 113 shown in FIG. 1). In some embodiments, the portion 172 is for a purpose of dilution of electric filed. Each of the portions 171, 172 and 173 of the dielectric layer 17 can be considered as a trench isolation, and the dielectric layer 17 can be considered as an integrated structure of multiple isolations. In some embodiments, the portion 171, the sidewall 214, the portion 173, and the sidewall 224 are line symmetric, wherein the line of symmetry is indicated as the dotted line LS in FIG. 15.

In addition, according to different depths of the portions 171, 172 and 173, in some embodiments, the portions 171 and 173 are referred to as trench isolations, and the portion 172 is referred to as shallow trench isolation (STI). It should be noted that "shallow" is a relative term to descript different isolations with different depths. In other embodiments, the portions 171 and 173 are referred to as shallow trench isolations, and the portion 172 is referred to as a super shallow trench isolation (SSTI).

The present disclosure provides a method of forming a semiconductor structure including a trench isolation with different depths and a planar top surface. The trench isolation can provide different functions for multiple purposes, and the planar top surface can provide a better manufacturing platform for following processing.

Figure 16:
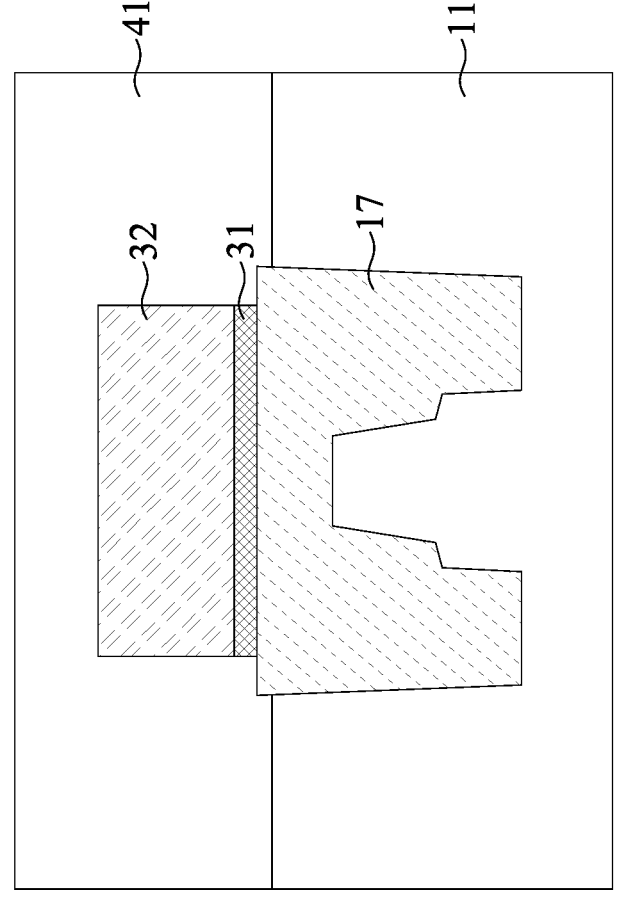
Figure 17:
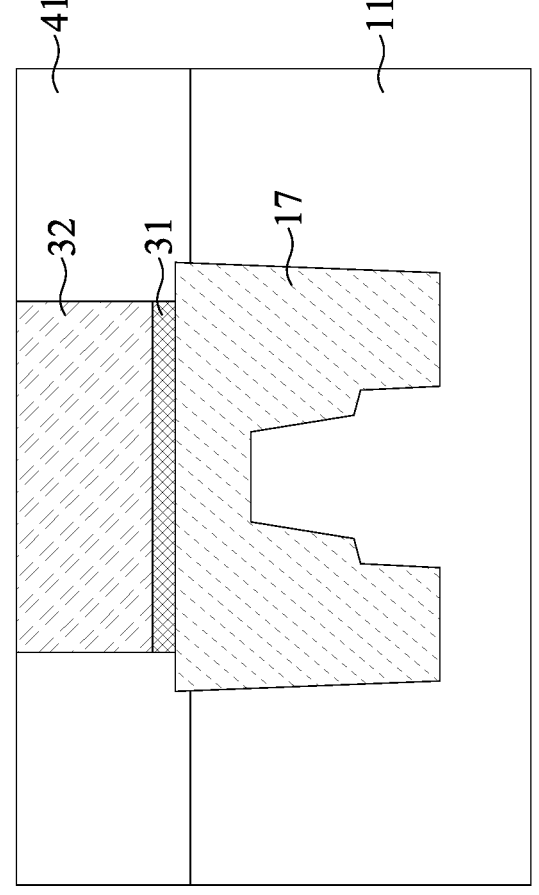

FIGS. 16 to 19 are schematic cross-sectional diagram of a metal gate replacement along the line A-A' shown in FIG. 3 at different stages of the method of the present disclosure. Referring to FIG. 16, a gate dielectric layer 31, a dummy gate layer 32, and an interlayer dielectric (ILD) layer 41 is formed over the substrate 11 in accordance with some embodiments of the present disclosure. In some embodiments, the gate dielectric layer 31 and the dummy gate layer 32 are disposed over the dielectric layer 17. In some embodiments, the gate dielectric layer 31 and the dummy gate layer 32 are entirely within an area of the top surface 17A from the cross section shown in FIG. 16. In some embodiments, the ILD layer 41 is formed after the formation of the gate dielectric layer 31 and a dummy gate layer 32. In some embodiments, the ILD layer 41 covers an entirety of the dummy gate layer 32 at the stage shown in FIG. 16. In some embodiments, a portion of the ILD layer 41 above the dummy gate layer 32 is removed in following processing as shown in FIG. 17. In some embodiments, a top surface of the dummy gate layer 32 is exposed through the ILD layer 41 as shown in FIG. 17.

Figure 18:
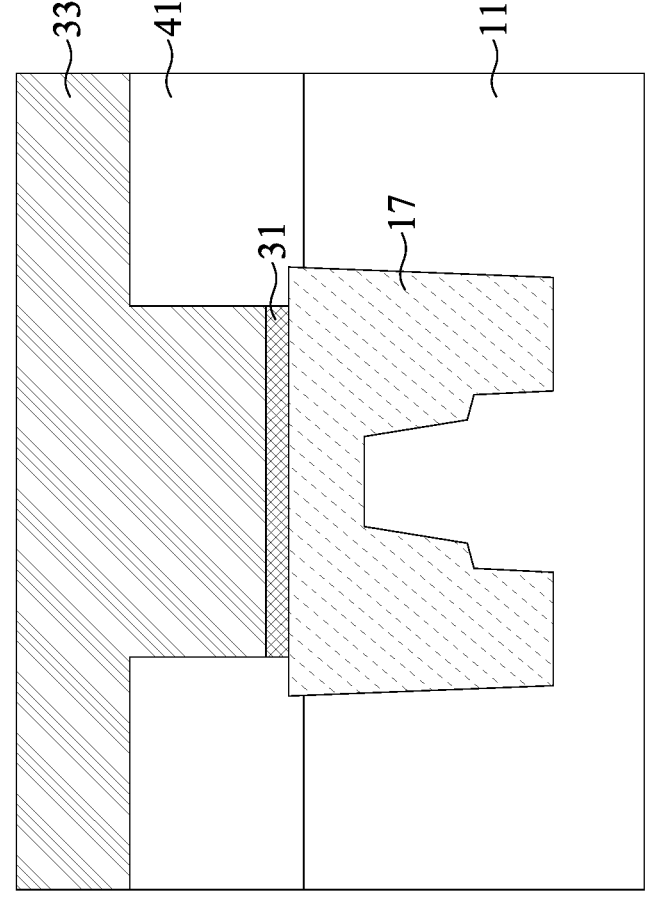
Figure 19:
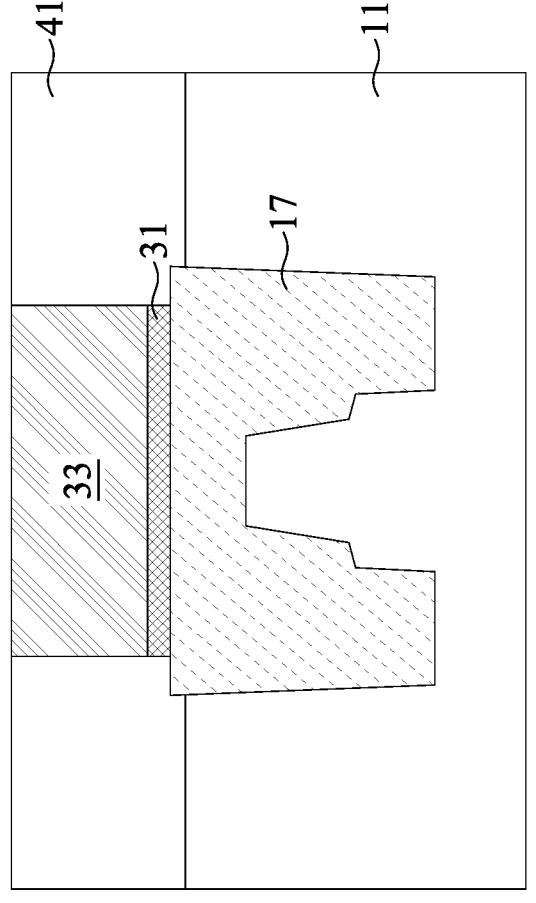

Referring to FIG. 18, the dummy gate layer 32 is removed, and a metal layer 33 is formed over the gate dielectric layer 31 and the ILD layer 41 in accordance with some embodiments of the present disclosure. A material of the metal layer 33 can include one or more suitable metallic materials. In some embodiments, the metal layer 33 includes copper (Cu), gold (Au), aluminum (Al), titanium nitride (TiN), tantalum nitride (TaN), zinc (Zn), tin (Sn), lead (Pb), magnesium (Mg), or a combination thereof. In some embodiments, the metal layer 33 fills the space where the dummy gate layer 32 were as shown in FIG. 18 and also covers a top surface of the ILD layer 41 at the stage shown in FIG. 18. Referring to FIG. 19, a portion of the metal layer 33 above the ILD layer 41 is removed in accordance with some embodiments of the present disclosure. In some embodiments, a top surface of the metal layer 33 is substantially aligned with the top surface of the ILD layer 41 as shown in FIG. 19. In some embodiments, the metal layer 33 is referred to as a metal gate layer or a gate electrode layer. In some embodiments, the metal layer 33 and the gate dielectric layer 31 together are referred to as a metal gate structure. The dielectric layer 31 may be damaged during the removal of the dummy gate layer 32, and it is optional to replace the dielectric layer 31 with another dielectric layer as a metal gate dielectric layer.

Since the top surface 17A of the dielectric layer 17 is a substantially planar surface, the top surface of the dummy gate layer 32 as shown in FIG. 17 is a substantially planar surface. Therefore, no residue is remained over the dummy gate layer 32 during the metal gate replacement. The present disclosure provides an integrated structure of isolations having a planar top surface, which can improve a result of the metal gate replacement and thereby improve a product yield.

Figure 20:
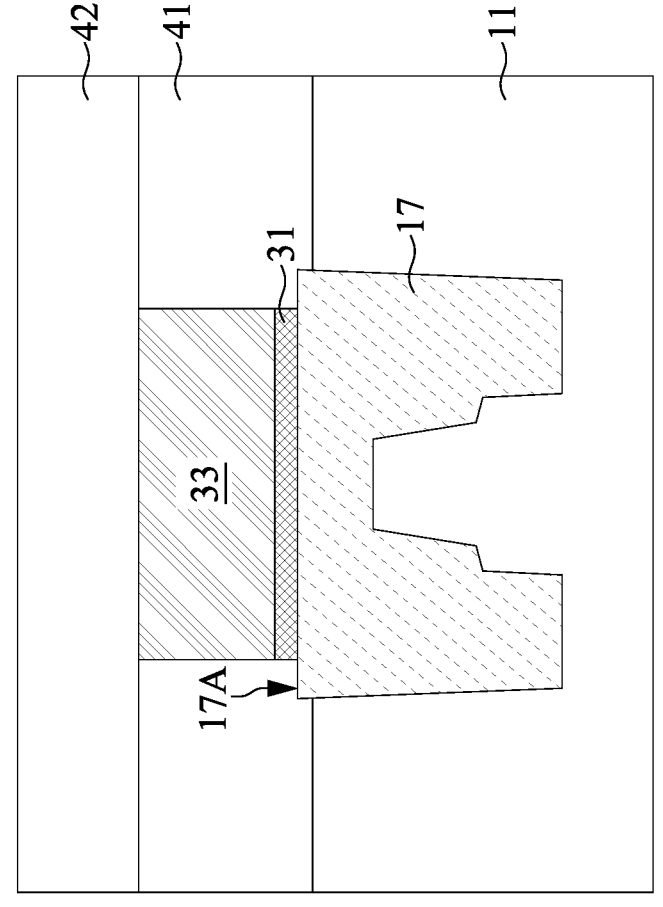
Figure 21:
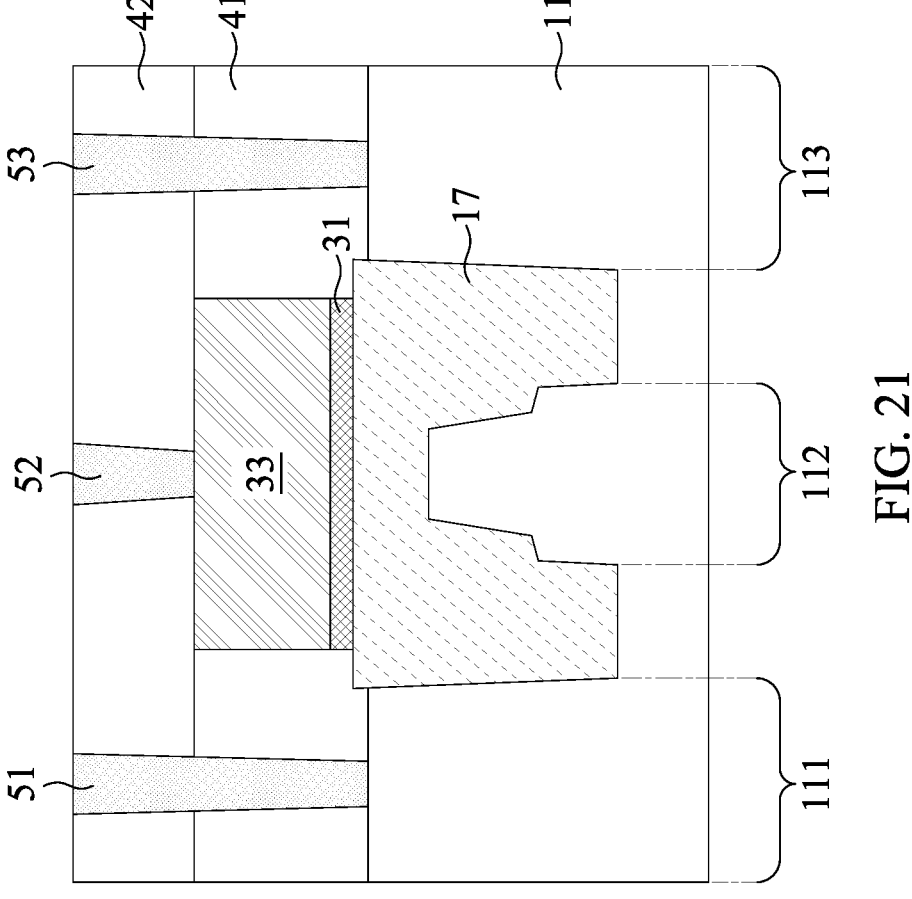

Referring to FIGS. 20 and 21, another ILD layer 42 is formed over the ILD layer 41, and a plurality of contact plugs 50 are formed. Some of the contact plugs may penetrate the ILD layer 42, and some of the contact plugs may penetrate the ILD layers 41 and 42. In some embodiments, a contact plug 51 of the plurality of contact plugs 50 penetrates the ILD layers 41 and 42 to electrically connect the active area 111. In some embodiments, a contact plug 52 of the plurality of contact plugs 50 penetrates the ILD layer 42 to electrically connect the metal layer 32 (or the metal gate structure). In some embodiments, a contact plug 53 of the plurality of contact plugs 50 penetrates the ILD layers 41 and 42 to electrically connect the active area 113.

Figure 22:
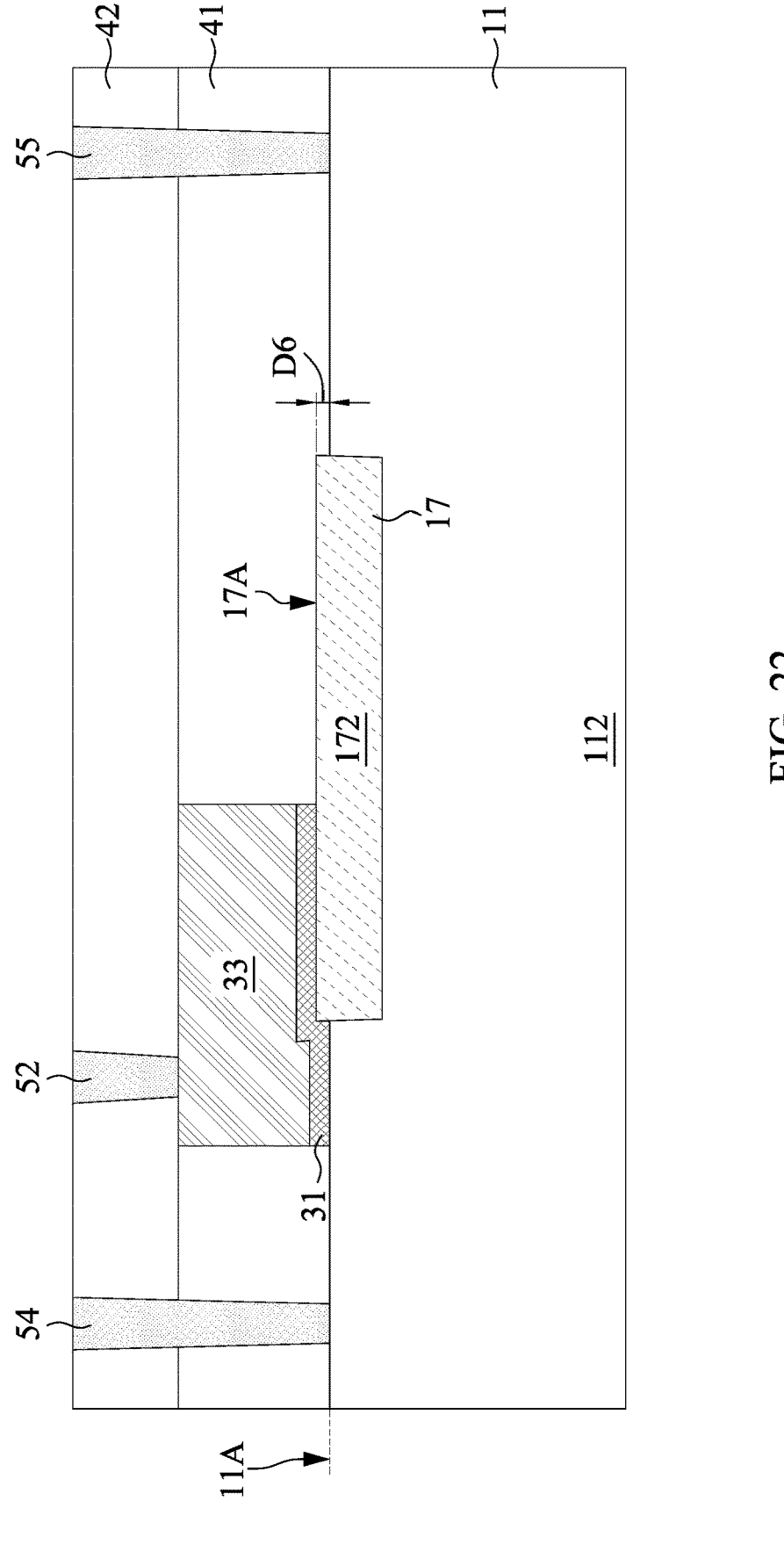
FIG. 22 is a schematic cross-sectional diagram of a semiconductor structure show in FIG. 21 along a line B-B' shown in FIG. 3 in accordance with some embodiments of the disclosure.

FIG. 22 is a schematic cross-sectional diagram of the semiconductor structure shown in FIG. 21 along the line B-B' in FIG. 3 in accordance with some embodiments of the present disclosure. In some embodiments, the metal layer 33 is a metal gate layer of a transistor in the active area 112. In some embodiments, a source region and a drain region of the transistor are separated by the metal gate structure or the portion 172 of the dielectric layer 17. In some embodiments, a contact plug 54 of the plurality of contact plugs 50 penetrates the ILD layers 41 and 42 to electrically connect the source region of the transistor. In some embodiments, a contact plug 55 of the plurality of contact plugs 50 penetrates the ILD layers 41 and 42 to electrically connect the drain region of the transistor. In some embodiments, a portion of the metal gate structure (e.g., the metal layer 33 and the gate dielectric layer 31) over the dielectric layer 17, and another portion of the metal gate structure is over the substrate 11. In some embodiments, the gate dielectric layer 31 is substantially conformal to a profiled defined by the top surface 11A of the substrate 11 and the top surface 17A of the dielectric layer 17. Due to the distance D6 is small (e.g., less than 30 nm), a top surface of the dummy gate layer 32 formed over the stepped gate dielectric layer 31 can be substantially planar (the intermediate structure at the stage shown in FIG. 17 along the B-B' is not shown but should be similar to the configuration of the metal layer 33 shown in FIG. 22). The metal gate replacement can be complete, and the presence the distance D6 should not be a concern of incomplete metal replacement.

To conclude the operations as illustrated in FIGS. 1 to 22 above, a method 700 and a method 800 within a same concept of the present disclosure are provided.

FIG. 23 is a flow diagram of the method 700 for manufacturing a semiconductor structure in accordance with some embodiments of the present disclosure. The method 700 includes a number of operations (701, 702, 703, 704 705 and 706) and the description and illustration are not deemed as a limitation to the sequence of the operations. In the operation 701, a first recess and a second recess adjacent to and separated from the first recess are formed in a substrate. In the operation 702, the first recess and the second recess are filled with a sacrificial layer. In the operation 703, a patterned layer is formed over the sacrificial layer and the substrate. In the operation 704, the sacrificial layer is patterned using the patterned layer as a mask, wherein a portion of the substrate between the first recess and the second recess, an upper portion of a first sidewall of the first recess proximal to the portion of the substrate, and an upper portion of a second sidewall of the second recess proximal to the portion of the substrate is exposed portions are exposed. In the operation 705, an etching operation is performed on the sacrificial layer and the substrate using the patterned layer as a mask. In the operation 706, a dielectric layer is formed in the first recess and the second recess, wherein the dielectric layer covers the portion of the substrate between the first recess and the second recess.

FIG. 24 is a flow diagram of the method 800 for manufacturing a semiconductor structure in accordance with some embodiments of the present disclosure. The method 800 includes a number of operations (801, 802, 803, 804, 805, and 806) and the description and illustration are not deemed as a limitation to the sequence of the operations. In the operation 801, a first trench is formed between active areas of a substrate, wherein the first trench extends from a first surface of the substrate. In the operation 802, a first layer is formed over the substrate and filling the trenches. In the operation 803, a second layer is formed over the first layer, wherein an opening of the second layer exposes a portion of the first trench and a portion of the substrate adjacent to the first trench from a top-view perspective. In the operation 804, the first layer is patterned using the second layer as a mask, wherein the patterning of the first layer stops above a bottom surface of the first trench. In the operation 805, a low-selective etching operation is performed using the second layer as a mask, thereby defining a second surface of the portion of the substrate below and substantially parallel to the first surface. In the operation 806, a dielectric layer is formed filling the first trench and covering the second surface of the portion of the substrate.

It should be noted that the operations of the method 700 and/or the method 800 may be rearranged or otherwise modified within the scope of the various aspects. Additional processes may be provided before, during, and after the method 700 and/or the method 800, and some other processes may be only briefly described herein. Thus, other implementations are possible within the scope of the various aspects described herein.

In accordance with some embodiments of the disclosure, a semiconductor structure is provided. The semiconductor structure includes a first, second and third isolations. The first isolation and a second isolation are disposed in a substrate and substantially parallel to each other, wherein a portion of the substrate is disposed between the first isolation and the second isolations. The third isolation is disposed over the portion of the substrate between the first and second isolations. A top surface of the third isolation is substantially aligned with top surfaces of the first and second isolations. A first step is between a bottom surface of the third isolation and a bottom surface of the first isolation. A second step between the bottom surface of the third isolation and a bottom surface of the second isolation.

In accordance with some embodiments of the disclosure, a method for manufacturing a semiconductor structure is provided. The method may include several operations. A first recess and a second recess adjacent to and separated from the first recess are formed in a substrate. The first recess and the second recess are filled with a sacrificial layer. A patterned layer is formed over the sacrificial layer and the substrate. The sacrificial layer is patterned using the patterned layer as a mask, wherein a portion of the substrate between the first recess and the second recess, an upper portion of a first sidewall of the first recess proximal to the portion of the substrate, and an upper portion of a second sidewall of the second recess proximal to the portion of the substrate is exposed portions are exposed. An etching operation is performed on the sacrificial layer and the substrate using the patterned layer as a mask. A dielectric layer is formed in the first recess and the second recess, wherein the dielectric layer covers the portion of the substrate between the first recess and the second recess.

In accordance with some embodiments of the disclosure, a method for manufacturing a semiconductor structure is provided. The method may include several operations. A first gate layer is formed over a substrate. A first trench is formed between active areas of a substrate, wherein the first trench extends from a first surface of the substrate. A first layer is formed over the substrate and filling the trenches. A second layer is formed over the first layer, wherein an opening of the second layer exposes a portion of the first trench and a portion of the substrate adjacent to the first trench from a top-view perspective. The first layer is patterned using the second layer as a mask, wherein the patterning of the first layer stops above a bottom surface of the first trench. A low-selective etching operation is performed using the second layer as a mask, thereby defining a second surface of the portion of the substrate below and substantially parallel to the first surface. A dielectric layer is formed filling the first trench and covering the second surface of the portion of the substrate.

The foregoing outlines features of several embodiments so that those skilled in the art may better understand aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
a first isolation and a second isolation, disposed in a substrate and substantially parallel to each other, wherein a portion of the substrate is disposed between the first isolation and the second isolation; and
a third isolation, disposed over the portion of the substrate between the first and second isolations,
wherein a top surface of the third isolation is substantially aligned with top surfaces of the first and second isolations,
a top surface of the substrate is exposed through the first isolation, the second isolation and the third isolation,
the top surface of the first isolation, the top surface of the second isolation and the top surface of the third isolation are higher than the top surface of the substrate,
a first step is between a bottom surface of the third isolation and a bottom surface of the first isolation, and
a second step between the bottom surface of the third isolation and a bottom surface of the second isolation.

2. The semiconductor structure of claim 1, wherein a width of a tread portion of the first step and the second step is in a range of 5 to 60 nanometers (nm).

3. The semiconductor structure of claim 2, wherein a vertical distance between the tread portion of the first step and the bottom surface of the third isolation is in a range 90 to 180 nm.

4. The semiconductor structure of claim 2, wherein an angle of elevation of the tread portion is in a range of 0 to 45 degrees.

5. The semiconductor structure of claim 1, wherein the first isolation, the first step, the third isolation, the second step and the second isolation are line symmetric.

6. The semiconductor structure of claim 5, wherein the first step and the second step are disposed below the bottom surface of the third isolation.

7. The semiconductor structure of claim 1, further comprising a gate structure, wherein the gate structure comprises:
a gate dielectric layer, disposed over the a portion of the first isolation, a portion of the second isolation and a portion of the third isolation, wherein a bottom surface of the gate dielectric layer is a planar surface; and a gate electrode layer, disposed over the gate dielectric layer.

8. The semiconductor structure of claim 7, further comprising a source region and a drain region, where the source region and the drain region are separated from each other by the gate structure and the third isolation.

9. A method of manufacturing a semiconductor structure, comprising:

forming a first recess and a second recess adjacent to and separated from the first recess in a substrate;

filling the first recess and the second recess with a sacrificial layer;

forming a patterned layer over the sacrificial layer and the substrate;

patterning the sacrificial layer using the patterned layer as a mask, wherein a portion of the substrate between the first recess and the second recess, an upper portion of a first sidewall of the first recess proximal to the portion of the substrate, and an upper portion of a second sidewall of the second recess proximal to the portion of the substrate are exposed;

performing an etching operation on the sacrificial layer and the substrate using the patterned layer as a mask; and forming a dielectric layer in the first recess and the second recess, wherein the dielectric layer covers the portion of the substrate between the first recess and the second recess.

10. The method of claim 9, wherein the patterning of the sacrificial layer stops above bottom surfaces of the first recess and the second recess.

11. The method of claim 9, wherein a surficial portion of the substrate exposed through the sacrificial layer is removed by the etching operation.

12. The method of claim 11, wherein a thickness of the surficial portion is in a range of 10 to 80 nm.

13. The method of claim 9, wherein a surficial portion of the sacrificial layer exposed through the patterned layer is removed by the etching operation.

14. The method of claim 9, wherein the forming of the first recess and the second recess comprises:

forming a stop layer over the substrate;

patterning the stop layer; and removing portions of the substrate using the patterned stop layer as a mask, thereby forming the first recess and the second recess.

15. The method of claim 14, further comprising:

performing a planarization on the dielectric layer and stopped on the stop layer; and removing the stop layer, wherein the dielectric layer having a substantially planar top surface above a top surface of the substrate after the planarization.

16. A method of manufacturing a semiconductor structure, comprising:

forming a first trench between active areas of a substrate, wherein the first trench extends from a first surface of the substrate;

forming a first layer over the substrate and filling the trenches;

forming a second layer over the first layer, wherein an opening of the second layer exposes a portion of the first trench and a portion of the substrate adjacent to the first trench from a top-view perspective;

patterning the first layer using the second layer as a mask, wherein the patterning of the first layer stops above a bottom surface of the first trench;

performing a low-selective etching operation using the second layer as a mask, thereby defining a second surface of the portion of the substrate below and substantially parallel to the first surface; and forming a dielectric layer filling the first trench and covering the second surface of the portion of the substrate.

17. The method of claim 16, further comprising:

forming an etch stop layer over the substrate prior to the formation of the first trench; and removing a portion of the etch stop layer over the portion of the substrate adjacent to the first trench.

18. The method of claim 17, wherein the patterning of the first layer comprises:

performing a first etching operation to expose the portion of the etch stop layer over the portion of the substrate adjacent to the first trench;

removing the portion of the etch stop layer over the portion of the substrate adjacent to the first trench after the first etching operation;

performing a second etching operation stopped above the bottom surfaces of the trenches; and performing the low-selective etching operation after the second etching operation.

19. The method of claim 16, further comprising:

forming a dummy gate over the portion of the substrate adjacent to the first trench;

replacing the dummy gate by a metal gate; and forming a contact plug electrically connecting the metal gate.

20. The method of claim 16, wherein a top surface of the dielectric layer is above the first surface of the substrate, and the method further comprises:

providing a solvent on the dielectric layer to reduce a distance between the top surface of the dielectric layer and the first surface of the substrate.

\* \* \* \* \*